United States Patent [19]

Crisenza et al.

[11] Patent Number: 5,798,279
[45] Date of Patent: Aug. 25, 1998

[54] METHOD OF FABRICATING NON-VOLATILE MEMORIES WITH OVERLAPPING LAYERS

[75] Inventors: Giuseppe Crisenza, Trezzo sull'Adda; Cesare Clementi, Busto Arsizio, both of Italy

[73] Assignee: SGS-Thomson Microelectronics S.r.l., Agrate-Brianza, Italy

[21] Appl. No.: 469,431

[22] Filed: Jun. 6, 1995

Related U.S. Application Data

[63] Continuation of Ser. No. 129,776, Sep. 30, 1993, abandoned.

[30] Foreign Application Priority Data

Sep. 30, 1992 [EP] European Pat. Off. ............ 92830541

[51] Int. Cl.⁶ .................................................. H01L 21/8247
[52] U.S. Cl. ............................... 437/43; 437/44; 437/191
[58] Field of Search ............................... 437/43, 44, 48, 437/52, 191

[56] References Cited

U.S. PATENT DOCUMENTS

| | | | |
|---|---|---|---|
| 3,984,822 | 10/1976 | Simko et al. | |
| 4,780,431 | 10/1988 | Maggioni et al. | 437/52 |
| 4,808,544 | 2/1989 | Matsui | 437/44 |
| 4,997,777 | 3/1991 | Boivin | 437/38 |
| 5,034,791 | 7/1991 | Kameyama et al. | |
| 5,053,849 | 10/1991 | Izawa | 437/44 |
| 5,104,819 | 4/1992 | Freiberger et al. | 437/43 |
| 5,120,668 | 6/1992 | Hsu et al. | 437/41 |
| 5,153,144 | 10/1992 | Komori et al. | 437/48 |
| 5,175,119 | 12/1992 | Matsutani | 437/43 |
| 5,200,350 | 4/1993 | Gill et al. | 437/43 |
| 5,202,277 | 4/1993 | Kameyama | 437/44 |
| 5,256,584 | 10/1993 | Hartmann | 437/43 |
| 5,304,504 | 4/1994 | Wei et al. | 437/44 |

FOREIGN PATENT DOCUMENTS

| | | |
|---|---|---|
| A-0 049 392 | 9/1981 | European Pat. Off. |
| 2 673 326 | 8/1992 | France ............ H01L 29/784 |
| A-3 813 665 | 4/1988 | Germany. |
| 41 05 636 | 8/1991 | Germany ............ G11C 16/02 |
| 0012565 | 1/1979 | Japan. |
| 0032539 | 2/1990 | Japan. |
| 0035777 | 2/1990 | Japan. |
| 4146627 | 5/1992 | Japan. |

OTHER PUBLICATIONS

T. Huang et al., "A New LDD transistor with Inverse-T Gate Structure," *IEEE Electron Device Letters*, EDL-8(4):151–153, 1987.

D. Wen et al., "A Self–Aligned Inverse–T Gate Fully Overlapped LDD Device for Sub–Half Micron CMOS," *International Electron Devices Meeting Technical Digest*, 765–768, 1989.

J.E. Moon et al., *IEEE Electron Device Letters*, vol. 11, No. 5, pp. 221–223, "A New LDD Structure: Total Overlap With Polysilicon Spacer (TOPS),"May 1990.

*Primary Examiner*—Chandra Chaudhari
*Attorney, Agent, or Firm*—David V. Carlson; Bryan A. Santarelli; Seed and Berry LLP

[57] ABSTRACT

A method comprising the steps of depositing a first and second polysilicon layer, separated by an oxide layer; selectively etching the second polysilicon layer to form first gate regions; forming first substrate regions in the substrate and laterally in relation to the first gate regions; selectively etching the first polysilicon layer to form second gate regions of a length greater than the first gate regions; and forming in the substrate, laterally in relation to the second gate regions and partially overlapping the first substrate regions, second substrate regions of a higher doping level than the first substrate regions.

16 Claims, 3 Drawing Sheets

METHOD OF FABRICATING NON-VOLATILE MEMORIES WITH OVERLAPPING LAYERS

CROSS-REFERENCE TO RELATED APPLICATION

This application is a continuation of U.S. patent application Ser. No. 08/129,776, filed Sep. 30, 1993, now abandoned.

TECHNICAL FIELD

The present invention relates to a method of fabricating non-volatile memories, and to the non-volatile memory produced thereby.

RELATED APPLICATIONS

This application claims priority from European patent application No.92830541.6 filed on Sep. 30, 1992, which is incorporated herein by reference. This application is closely related to a U.S. application filed concurrently herewith titled "Method of Fabricating Integrated Devices and Integrated Device Produced Thereby" which related application claims priority from European patent application No. 92830542.4, filed on Sep. 30, 1992.

BACKGROUND OF THE INVENTION

At present, non-volatile memories integrate, in the same substrate, memory cells and transistors fabricated simultaneously and hereinafter referred to in general as "devices". For this purpose, various methods are known and which, subsequent to defining the active areas, consist in implanting isolating regions; growing the field oxide; depositing a first polycrystalline silicon (polysilicon) layer; effecting a first shaping (definition) of the first polysilicon layer; depositing an intermediate dielectric layer (dielectric interpoly); removing the dielectric interpoly from the circuit areas not accommodating memory cells; depositing a second polysilicon layer; defining the gate regions in the transistors and memory cells; implanting source and drain; and, finally protecting and interconnecting the devices.

In recent years, for integrated circuit transistors in general, a so-called ITLDD (Inverse T Low Doped Drain) structure has been devised, which has the advantage of withstanding the hot electron injection stress typical of submicrometer structures. For this reason, the ITLDD structure is among the most favored for transistors with gate lengths below 0.5 μm, but presents serious difficulties in terms of production and industrialization, as outlined below.

The first proposal for such a structure appeared in 1986 (cf. articles by Huang, T. Y. and others entitled "A novel submicron LDD transistor with inverse-T gate structure" *IEEE-IEDM* 1986, p. 742, and "A new LDD transistor with inverse-T gate structure" *IEEE Electron Dev. Letters*, 8, 1987, p. 151). These deal with a standard transistor in which the etching for defining the gate region is stopped at a certain level to give the desired structure, but not without obvious problems in terms of etching controllability and repeatability. So much so that, in the second of the above articles, alternative solutions are outlined for simplifying the etching stage, and, in a follow-up proposal, recourse is made by the same writer to two distinct gates, one wider and the other narrower, contacted by polysilicon spacers.

An alternative to the above process is described, for example, in an article by Izawa, R. and others entitled "Impact of the Gate-Drain Overlapped Device (GOLD) for deep submicrometer VLSI" *IEEE Transactions Elect. Dev.* 35, 1988, p. 2088. According to this process, which was later to become widely used, a first thin polysilicon layer is deposited; a very thin layer of native oxide (5–10 Å) is grown by exposure to air; a second polysilicon layer is deposited on the oxide layer; the second polysilicon layer is etched highly selectively, so as to stop at the thin oxide layer; the low-doped regions are implanted through the native oxide layer, the first polysilicon layer and the gate oxide layer; an LPCVD (Low Pressure Chemical Vapor Deposition) oxide layer is deposited and etched to define the lateral spacers; the first thin polysilicon layer is etched; partial lateral re-oxidation of the thin polysilicon layer is effected; and the high-doped regions are implanted. In this way, overlapping of the transistor gate region and the low-doped regions does not depend on the size of the spacers.

The above known process is especially critical as regards selective etching of the second polysilicon layer, which requires extremely selective technology (100 to 1 is the figure mentioned) for selecting between the polysilicon and oxide, if the etching process is to be repeatable uniformly on a silicon wafer. What is more, no direct contact exists between the gate region parts separated by the native oxide layer, which, albeit thin, could impair electrical continuity. Finally, precise control of the lateral oxidation length of a doped polysilicon layer is not as straightforward as it would at first appear.

To overcome the above drawbacks, further processes have been proposed, such as that described in an article by Pfiester, J. and others entitled "A self-aligned LDD/channel implanted ITLDD process with selectively-deposited poly gates for CMOS VLSI" *IEEE-IEDM*, 1989, p. 253). This consists in forming the gate regions inside openings in an appropriate oxide layer over the first polysilicon layer; removing the oxide layer; implanting the low-doped regions; forming oxide spacers; and implanting the high-doped regions.

The process described in an article by Moon, J. E. and others entitled "A New LDD Structure: Total Overlap with Polysilicon Spacer (TOPS)" *IEEE Electron Dev. Letters*, 11, 1990, p. 221, consists in forming appropriately thick polysilicon spacers for electrically contacting the top part of the gate region, formed from a thick polysilicon layer, and the bottom part of the gate region, formed from a thin polysilicon layer and separated from the first by an oxide layer. In this case, the low-doped regions are implanted through the oxide and thin polysilicon layers prior to forming the spacers, and the high-doped regions are implanted after they are formed.

In the process described in an article by Wen, D. S. and others entitled "A Self-Aligned Inverse T Fully Overlapped LDD Device for Sub-Half Micron CMOS" *IEEE-IEDM*, 1989, p. 765, the problem of contacting the two parts of the gate region is solved by depositing a thin polysilicon layer after defining the thicker part of the gate region and before defining the oxide for the spacers, which obviously complicates the process by introducing additional deposits and etching. In this case also, a dummy oxide or TiN layer is used for arresting etching of the polysilicon in the thicker part of the gate region, thus resulting in selectivity problems, especially when overetching.

Other processes proposed for fully overlapping the gate region and low-doped regions (cf. the article by Hori, T. and others entitled "A New Submicron MOSFET With LATID (Large-Tilt Angle Implanted Drain) Structure" *Int. Symp.*

*VLSI Technology Dig* 1988, p. 15) consist in implanting the above regions by sharply tilting the beam and semiconductor wafer. Such a technique presents difficulties in controlling the junction profile, and, what is more, results in direct injection of the charge into the gate oxide.

All the above processes (and others not mentioned) have met with only a limited amount of success, due to the manufacturing difficulties involved, and at any rate are limited in scope to integrated circuit transistors in general.

Undoubtedly, an inverse-T profile as proposed is disadvantageous as regards capacitive coupling of the gate and drain regions, and detrimental to the speed of the device. Nevertheless, analysis of the structure has shown advantages are to be afforded by using such a profile for the gate region. Some of the above articles in fact show how optimizing dosage of the low-doped regions and overlap length may minimize the above drawback and so limit the theoretical coupling increase to 10%, the consequences of which are further reduced by virtue of a big improvement in the source and drain series resistance values.

SUMMARY OF THE INVENTION

It is an object of the present invention to provide an improved method of fabricating non-volatile memories, based on the principle of partially overlapping the gate region on low-doped regions with an LDD type structure; which method provides for eliminating the drawbacks typically associated with known methods, for enabling trouble free, low-cost implementation, and for ensuring the production of high-performance devices.

According to the present invention, there is also provided a non-volatile memory produced using the method according to the present invention and as claimed in claim 9.

A preferred non-limiting embodiment of the present invention, relative to the fabrication of a non-volatile memory, will be described with reference to the accompanying drawings.

DETAILED DESCRIPTION OF THE INVENTION

The accompanying drawings show intermediate structures formed using the method according to the present invention, and relative to an EPROM memory and a pair of CMOS transistors, each integrated in a respective tub according to the twin tub process.

Figure 1:
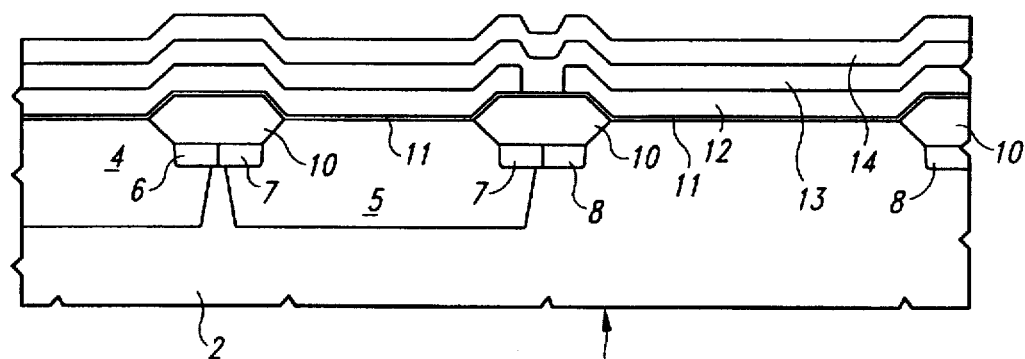
FIGS. 1 to 6 show cross sections of a wafer of semiconductor material at various stages in the method according to the present invention.
Figure 7:
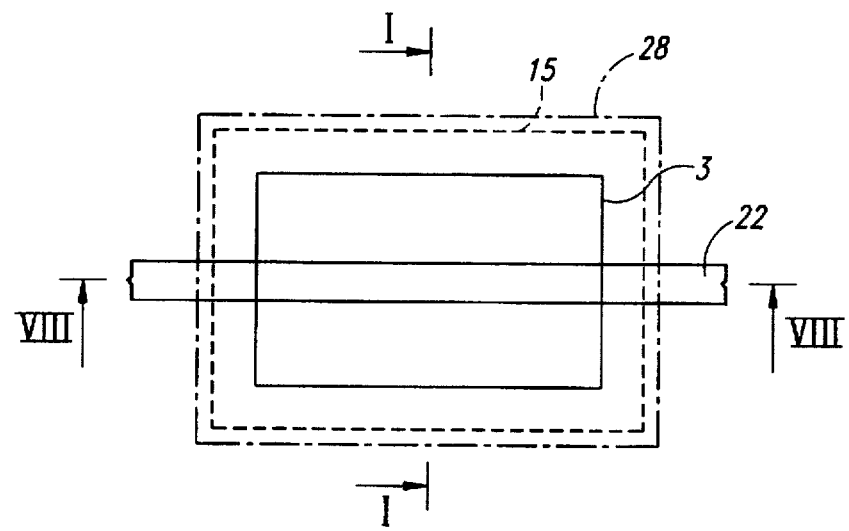
FIG. 7 shows a schematic view of the masks employed for the memory circuit transistors.

As shown in FIG. 1, the method commences with a silicon wafer 1 including a substrate 2 having twin tubs 4 and 5 of opposite conductivity, for housing respective circuit MOS transistors such as those in the peripheral circuit, as one example.. The active areas are defined on wafer 1 using standard masking processes (the relative mask is shown by continuous line 3 in FIG. 7, which shows, one on top of the other, the various masks employed in the method described herein for one of the circuit transistors), and isolation regions 6, 7, 8 of appropriate conductivity are implanted between the active areas. The field oxide is then grown (to form regions 10), and an N type implant made in the memory cell area (right half of FIG. 1). Sacrificial oxidation is then effected, in known manner, on the active areas, and, following removal of the oxide layer so formed, gate oxide 11 (FIG. 1) is grown thermally. On top of gate oxide 11, a layer of polycrystalline silicon (first poly 12), appropriately doped to improve conductivity, is grown and then shaped by means of standard masking and etching operations, so as to produce, in the memory cell area, polysilicon strips extending parallel to strip 12 in FIG. 1 and in a plane perpendicular to that of the drawing.

On top of first poly 12, a layer of dielectric material (dielectric interpoly 13) is formed, and a suitably thick second polysilicon layer (second poly 14) is deposited for protecting dielectric layer 13, and so producing the intermediate structure shown in FIG. 1.

Figure 2:
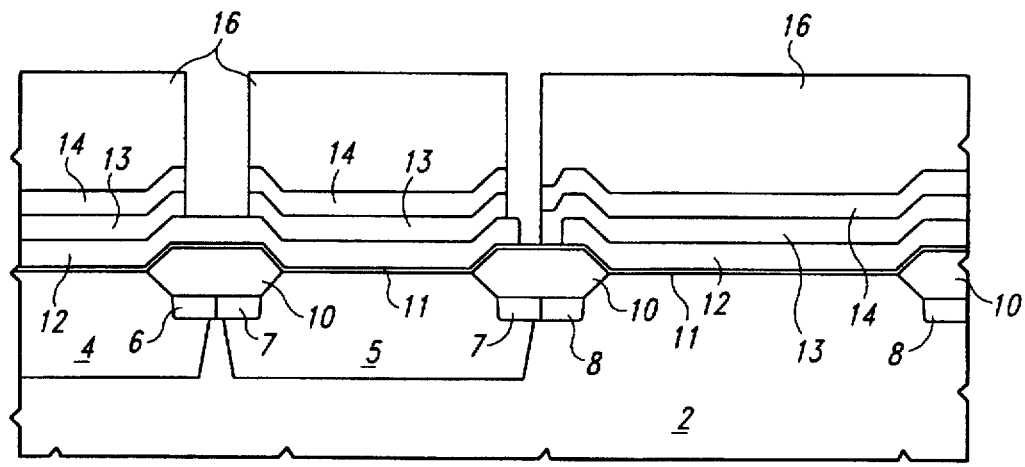

An array mask is then deposited, so that a suitably shaped resist layer 16 covers the whole of polysilicon layer 14 in the memory cell area, and the active areas in the circuitry area. The design of the photolithographic mask at this stage differs as compared with that of standard processes, and, for a circuit transistor, is as shown by dotted line 15 in FIG. 7. The portions of polysilicon layer 14 and dielectric layer 13 not covered by resist layer 16 are then removed by plasma etching, to give the intermediate structure shown in FIG. 2.

Figure 3:
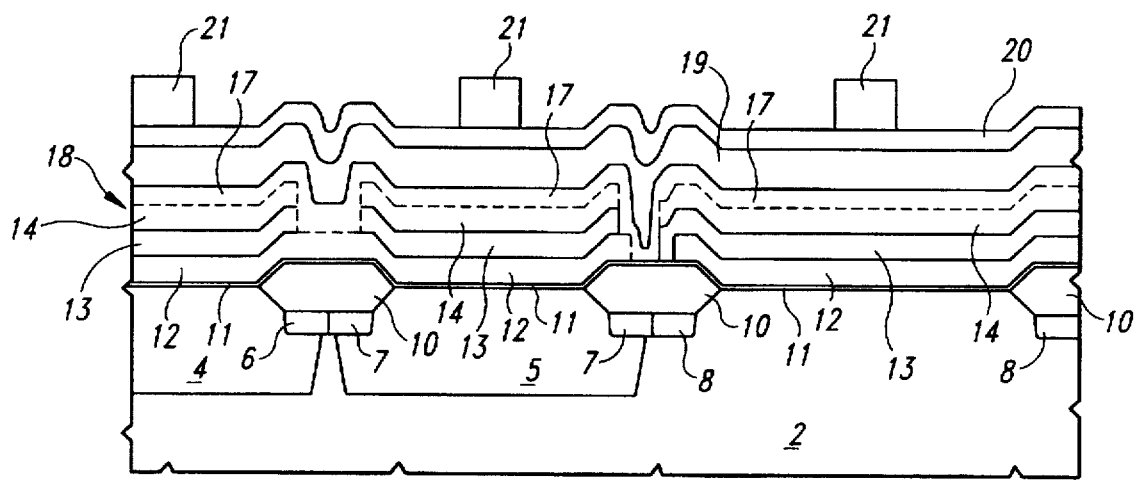

Following removal of resist layer 16, a threshold adjusting implant is made in the circuit transistor active area outside the memory cell array, and a third polycrystalline silicon layer 17 (FIG. 3) is deposited. Layer 17 is physically deposited onto the exposed areas and thus is in direct electrical contact with first poly layer 12 where second poly 14 and dielectric layer 13 have been removed (over field oxide regions 10 surrounding each circuit transistor, as shown also in the FIG. 8 section), and elsewhere is in direct electrical contact with second poly layer 14 (over the active areas of the circuitry and in the memory cell area) according to a selected masking pattern. Hereinafter, the layer resulting from overlapping layers 14 and 17 will be referred to as layer 18, since it does in fact act as a single layer. The top layer 17 is then appropriately doped to improve conductivity.

In summary, where it is desired to form a floating gate, the poly layer 17 contacts the second poly layer 14 but does not contact the first poly layer 12. Second poly layer 14 and first poly layer 12 remain electrically insulated from each other. On the other hand, where it is desirable to form a standard MOS transistor with first poly 12 as the gate of a standard MOS transistor, the masking pattern is selected to expose both poly layers 12 and 14 when poly layer 17 is deposited such that poly layers 12 and 14 are physically connected via layer 17 and are electrically short circuited together. The transistors that are selected to be shorted together include circuit transistors is the peripheral circuitry and other circuit transistors on the chip as the circuit designs may select.

A 2500 Å thick silicide layer 19 ($WSi_2$) is then deposited and, over this, an LPCVD silicon oxide layer 20. The LPCVD silicon oxide layer 20 is not present in prior art processes,, and the etching of it is thus not present in thee prior art processes. A suitably shaped photoresist layer is then deposited for defining the memory cell control gates and the circuit transistor gate regions, and so producing the structure shown in FIG. 3, which also shows resist layer 21 after shaping. The relative mask is also shown by continuous line 22 in FIG. 7.

Figure 4:
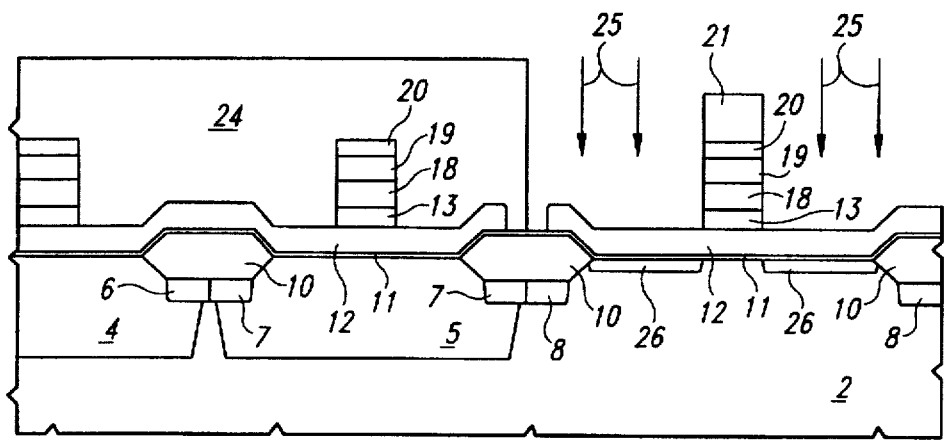

At this point, oxide layer 20, silicide layer 19, polysilicon layer 17 and layer 14 (if any) are plasma etched down to dielectric layer 13, which thus acts as a gate etching stop layer when defining the gate. Using the same mask, dielectric layer 13 is then etched by means of a further, polysilicon-selective, etching operation; a further resist mask 24 (FIG. 4) is deposited over mask 21, so as to leave only the memory cells exposed; and N type doping ions (e.g., a 7E13 at/cm² dose of phosphorous at 80 KeV) are implanted through first polysilicon layer 12 and gate oxide layer 11, as shown by arrows 25 in FIG. 4, so as to form, in the cell area of substrate 2, low-doped regions 26 aligned with the shaped stack formed by layers 13, 18, 19, 20, and so produce the intermediate structure shown in FIG. 4.

Following removal of the double resist layer 21, 24, a further resist layer is deposited and selectively etched with a masking pattern (not shown in FIGS. 1–6 but the shape of which, for a single transistor, is shown by dot-and-dash line 28 in FIG. 7) for implanting N type doping ions through first polysilicon layer 12 in the N channel transistor active areas of the circuitry as selected. At this stage, a 6E13 at/cm² dose of phosphorous at 110 KeV is typically employed, for producing regions 29 in tubs 5 (FIG. 5).

Following removal of the above mask, a further mask layer (of the same shape as mask 28) is deposited for implanting P type doping ions through first polysilicon layer 12 in the P channel transistor active areas of the peripheral circuitry. At this stage, a 3.5E13 at/cm² dose of boron at 45 KeV is typically implanted, for producing regions 30 in tubs 4 (FIG. 5).

Figure 5:
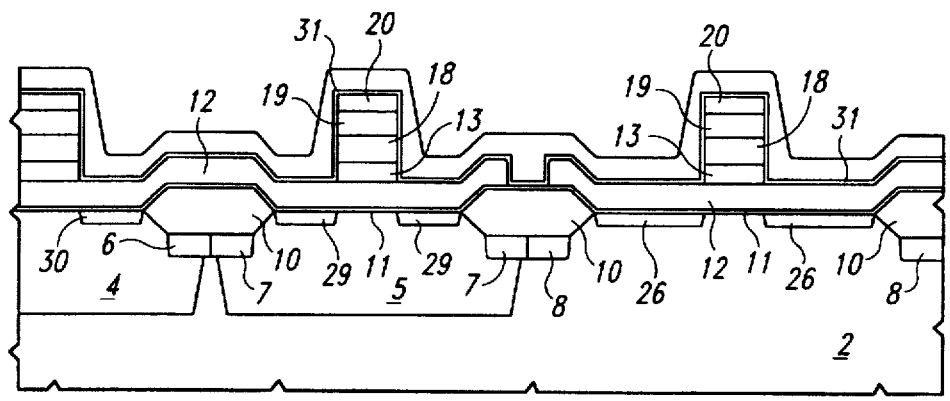

Following removal of the above mask, the overlapping layers in the stack are re-oxidized laterally in a controlled atmosphere to form a thin oxide layer 31 (FIG. 5); and an LPCVD silicon oxide layer 32 is deposited, to produce the intermediate structure shown in FIG. 5.

Oxide layer 32 is plasma etched immediately to form lateral spacers 33 (FIG. 6) to the side of stacked silicide and polysilicon layers 19 and 18. The deposition and subsequent etching of the upper oxide layer 32 to form the described lateral spacers is one of novel features contributed by one embodiment of the present invention.

Figure 6:
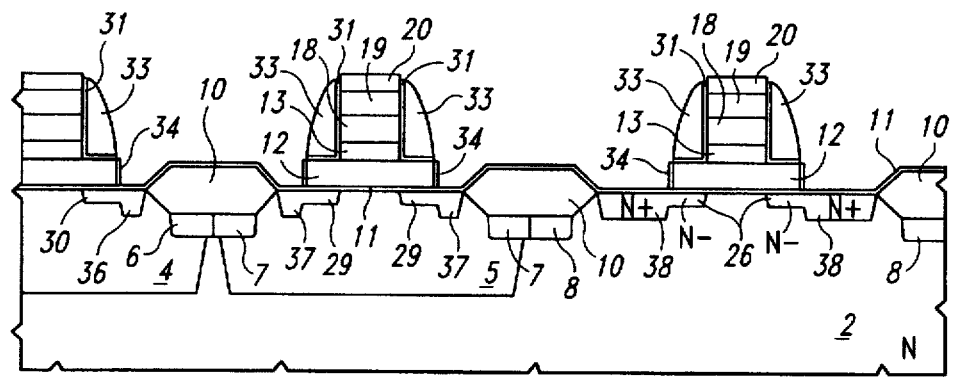
Figure 8:
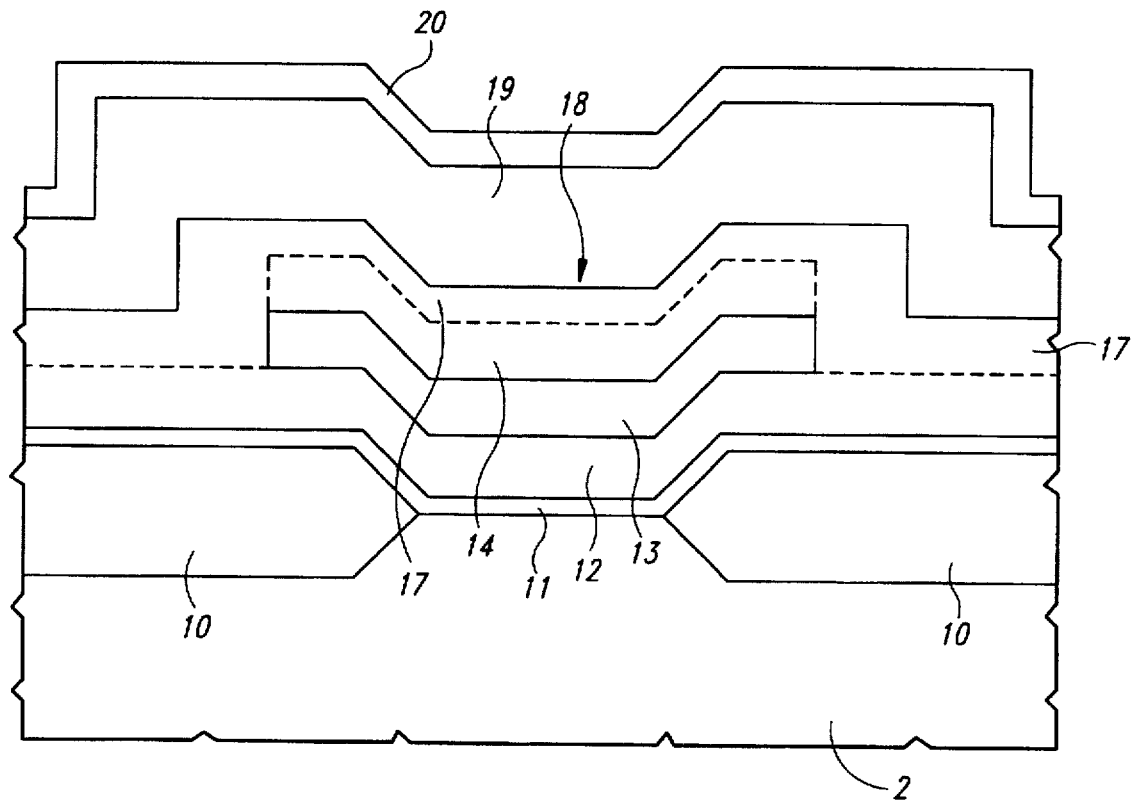
FIG. 8 shows a cross section of a circuit transistor, perpendicular to the FIG. 1–6 section.

By means of further plasma etching, first polysilicon layer 12 is then shaped so that, as shown in the FIG. 6 section, it is self-aligned with spacers 33, thus defining the floating gate of the memory cells (to the right in FIG. 6) and also the bottom part of the gate region of any transistor, which has previously been short circuited at the top part defined by layer 14 in regions on the chip up- and downstream from the FIG. 6 plane, as shown in FIG. 8.

Following minor protective re-oxidation (thin layers 34) of the lateral surface of layer 12 exposed by the above plasma etching surface of layer 12 exposed by the above plasma etching operation, appropriate masks (similar to 28) are deposited for making an N type and P type implant self-aligned with the gate regions formed by the remaining portions of layer 12, and so forming regions 36, 37, 38 (the first a P type and the other two N types) in tubs 4, tubs 5 and memory cell substrate 2, respectively. The resulting intermediate structure is as shown in FIG. 6. Transistors and cells similar in structure to known LDD (Light Doped Drain) devices are thus obtained, but in which, by virtue of the method employed, the bottom part of the gate region in the transistors and the floating gate in the cells partially overlap the low-doped regions.

The method then continues with the usual steps presently known in the art including: depositing a dielectric layer in which the contacts are defined; depositing and shaping a metal layer; and, finally, depositing a final passivation layer for externally insulating the memory.

The advantages of the method according to the present invention will be clear from the foregoing description. Firstly, by virtue of the ITLDD structure, it provides for producing transistors of improved performance, particularly as regards hot-carrier reliability, which is especially advantageous in the case of line decoding transistors subjected to high voltages.

Secondly, it provides for forming the memory cells in the same steps for forming circuit transistors and any other transistors on the chip that are not selected to be floating gate transistors by selectively utilizing a double short circuited poly concept on selected transistor structures. Thus enabling, as far as peripheral circuit transistors are concerned, low-cost production of devices otherwise involving unusual or unfeasible manufacturing processes.

To those skilled in the art it will be clear that changes may be made to the method and device as described and illustrated herein without, however, departing from the scope of the present invention.

We claim:

1. A method of fabricating non-volatile memories, including integrated devices in a substrate of semiconductor material, said method comprising the steps of:

depositing a first polycrystalline silicon layer on said substrate;

depositing a layer of insulating material on said first polycrystalline silicon layer;

depositing at least a second polycrystalline silicon layer on said layer of insulating material; and defining the gate regions of said devices, said defining the gate regions including the steps of:

selectively etching said second polycrystalline silicon layer for forming first gate regions of a first length in a first direction;

selectively etching said first polycrystalline silicon layer for forming second gate regions of a second length, greater than said first length, in said first direction;

following said step of selectively etching said second polycrystalline silicon layer, and prior to said step of selectively etching said second polycrystalline silicon layer, the step is performed of forming, in said substrate and self-aligned with said first gate regions, first substrate regions having a first doping level; and following said step of selectively etching said first polycrystalline silicon layer, the step is performed of forming in said substrate, self-aligned with said second gate regions, and partially overlapping said first substrate regions, second substrate regions having a second doping level, greater than said first doping level;

wherein said step of depositing said second polycrystalline silicon layer is preceded by the step of shaping said layer of insulating material for defining insulating portions of said layer of insulating material of a selected width in a second direction perpendicular to said first direction; and during said step of depositing said second polycrystalline silicon layer, said second polycrystalline silicon layer contacts said first polycrystalline silicon layer electrically at least a portion of said second polycrystalline silicon layer extending from said insulating portions in said second direction.

2. A method as claimed in claim 1 wherein said step of selectively etching said second polycrystalline silicon layer is followed by the step of selectively etching said layer of insulating material; and wherein that said step of forming said first substrate regions is includes doping ion implantation through said first polycrystalline silicon layer.

3. A method as claimed in claim 2 wherein said layer of insulating material is formed from dielectric material.

4. A method as claimed in claim 1 further including, following said step of forming said first substrate regions, and prior to said step of selectively etching said first polycrystalline silicon layer, a step is performed of forming lateral spacers to the side of said first gate regions;

wherein said step of forming said spacers includes the steps of depositing and selectively etching a second layer of insulating material.

5. A method of fabricating an integrated circuit that includes a plurality of non-volatile memory cells and a plurality of transistors, comprising the steps of:

forming a gate oxide layer on a substrate;

depositing a first polysilicon layer on top of said gate oxide;

forming a first layer of insulating material overlying said first polysilicon layer;

depositing a second layer of polysilicon overlying said first insulating layer;

selectively etching said second polysilicon layer to form first gate regions having a first length in a first direction;

forming a plurality of first doped regions having a first doping level in said substrate, said first doped regions including regions that are overlaid by said first polysilicon layer;

selectively etching said first polysilicon layer to form second gate regions having a second length in said first direction, the second length being longer than said first length in said first direction, said second gate regions of said transistors electrically coupled to said respective first gate regions of said transistors at a periphery of one of said respective first and second gate regions, said second gate regions of said memory cells electrically insulated from said respective first gate regions of said memory cells; and forming a plurality of second doped regions having a second doping level in said substrate after said step of selectively etching the first polysilicon layer, said second doped regions overlapping only a portion of said first doping regions and extending away from the substrate region overlaid by the first layer of polysilicon, said second doping level being greater than said first doping level.

6. A method of fabricating an integrated circuit that includes a plurality of non-volatile memory cells, the method comprising the steps of:

forming a gate oxide layer on a substrate;

depositing a first polysilicon layer on top of said gate oxide;

forming a first layer of insulating material overlying said first polysilicon layer;

depositing a second layer of polysilicon overlying said first insulating layer;

selectively etching said second polysilicon layer to form a first gate region having a first length in a first direction;

forming a plurality of first doped regions having a first doping level in said substrate, said first doped regions including regions that are overlaid by said first polysilicon layer;

selectively etching said first polysilicon layer to form a second gate region having a second length in said first direction, the second length being longer than said first length in said first direction;

forming a plurality of second doped regions having a second doping level in said substrate after said step of selectively etching the first polysilicon layer, said second doped regions overlapping only a portion of said first doping regions and extending away from the substrate region overlaid by the first layer of polysilicon, said second doping level being greater than said first doping level, etching said second polysilicon layer and said first layer of insulating material in selected locations to simultaneously expose first selected portions of said first polysilicon layer and said second polysilicon layer and to not expose other second selected portions of said first polysilicon layer; and depositing a third layer of polysilicon onto the exposed selected portions of the first and second polysilicon layers to provide a layer of polysilicon physically connecting the first layer of polysilicon and the second layer of polysilicon at selected locations and doping the exposed polysilicon layer such that some regions of the second polysilicon layer that directly overlay the first polysilicon layer are electrically connected together to form a gate of a standard MOS transistor at the first selected regions but the first and second polysilicon layers being electrically insulated from each other at the second selected regions on the integrated circuit to form a gate structure having a floating gate and a control gate of the non-volatile memory cell.

7. A method of fabricating an integrated circuit that includes a plurality of non-volatile memory cells comprising the steps of:

forming a gate oxide layer on a substrate;

depositing a first polysilicon layer on top of said gate oxide;

forming a first layer of insulating material overlying said first polysilicon layer;

depositing a second layer of polysilicon overlying said first insulating layer;

depositing a second layer of insulating material overlying said second layer of polysilicon material;

selectively etching said second insulating material and said second polysilicon layer to form a first gate region;

forming a plurality of first doped regions having a first doping level in said substrate;

etching said first polysilicon layer to form a second gate region using said second layer of insulating material as a mask layer over the second polysilicon layer to prevent etching of the second polysilicon layer while the first polysilicon layer is etched; and forming a plurality of second doped regions having a second doping level in said substrate, said second doped regions overlapping only a portion of said first doping regions;

wherein said first and second gate regions are coupled together at a location that is laterally outward from said first and second doped regions.

8. The method according to claim 7 wherein only a single photoresist layer is exposed to obtain the masking pattern to prevent etching of the second insulating layer, the second polysilicon layer and the first insulating layer, and further including the step of: removing said photoresist prior to etching said first polysilicon layer.

9. The method according to claim 7 wherein said first gate region is formed having a first length in a first direction and said second gate region is formed having a second length in said first direction, the second length being longer than said first length in said first direction to form an inverse T structure.

10. The method according to claim 7 or 8 or 9, further including the step of forming lateral sidewall oxide spacers on the sidewalls of said first gate regions prior to etching said first polysilicon layer.

11. The method according to claim 7 or 9 wherein said step of forming a plurality of first doped regions in the substrate includes the step of:
   ion implanting a dopant into the substrate through said gate oxide and through said first polysilicon layer overlying the first doped regions at those regions where the first polysilicon is not overlayed by the second polysilicon layer and thus forming the first doped regions in the substrate and regions that are overlayed by said first polysilicon layer and not in those regions which are overlayed by both the first and second polysilicon layers by using a mask that is comprised of a plurality of stacked masking layers that include the second polysilicon layer as one of the layers in the stacked mask.

12. A method of fabricating non-volatile memories, including integrated devices in a substrate of semiconductor material, said method comprising the steps of:
   depositing a first polycrystalline silicon layer on said substrate;
   depositing a layer of insulating material on said first polycrystalline silicon layer;
   depositing at least a second polycrystalline silicon layer on said layer of insulating material; and
   defining the gate regions of said devices, said defining the gate regions including the steps of:
      selectively etching said second polycrystalline silicon layer for forming first gate regions of a first length in a first direction;
      selectively etching said first polycrystalline silicon layer for forming second gate regions that are each coupled to a respective first gate region at outer portions of said first and second gate regions;
      following said step of selectively etching said second polycrystalline silicon layer, and prior to said step of selectively etching said first polycrystalline silicon layer, the step is performed of forming, in said substrate and self-aligned with said first gate regions, first substrate regions having a first doping level;
      following said step of forming said first substrate regions, and prior to said step of selectively etching said first polycrystalline silicon layer, a step is performed of:
         forming lateral spacers on the side of said first gate regions; and
         following said step of selectively etching said first polycrystalline silicon layer, the step is performed of forming in said substrate, self-aligned with said second gate regions, and partially overlapping said first substrate regions, second substrate regions having a second doping level, greater than said first doping level.

13. The method according to claim 12 in which said second gate regions have a second length, said second length being greater than said first length in said first direction.

14. A method of fabricating non-volatile memories, including integrated devices and memory cells in a substrate of semiconductor material, said method comprising the steps of:
   depositing a first polycrystalline silicon layer on said substrate;
   depositing a layer of insulating material on said first polycrystalline silicon layer;
   depositing at least a second polycrystalline silicon layer on said layer of insulating material; and
   defining the gate regions of said devices and memory cells, said defining the gate regions including the steps of:
      selectively etching said second polycrystalline silicon layer for forming first gate regions of a first length in a first direction;
      selectively etching said first polycrystalline silicon layer for forming second gate regions of a second length, greater than said first length, in said first direction, said second gate regions of said devices respectively connected to said first gate regions of said devices laterally outward of active areas of said respective devices;
      following said step of selectively etching said second polycrystalline silicon layer, and prior to said step of selectively etching said first polycrystalline silicon layer, the step is performed of forming, in said substrate and self-aligned with said first gate regions, first substrate regions having a first doping level;
      following said step of selectively etching said first polycrystalline silicon layer, the step is performed of forming in said substrate, self-aligned with said second gate regions, and partially overlapping said first substrate regions, second substrate regions having a second doping level, greater than said first doping level; and
      further including the step of defining said first polycrystalline silicon layer prior to said step of depositing said layer of insulating material; and
      said step of selectively etching said second polycrystalline silicon layer includes the step of defining control gate regions of said cells; and
      said step of selectively etching said first polycrystalline silicon layer includes the step of defining floating gate regions of said cells.

15. A method of fabricating an integrated circuit that includes a plurality of non-volatile memory cells comprising the steps of:
   forming a gate oxide layer on a substrate;
   depositing a first polysilicon layer on top of said gate oxide;
   forming a first layer of insulating material overlying said first polysilicon layer;
   depositing a second layer of polysilicon overlying said first insulating layer;
   selectively etching said second polysilicon layer to form a first gate region having a first length in a first direction;
   forming a plurality of first doped regions having a first doping level in said substrate, said first doped regions including regions that are overlaid by said first polysilicon layer, said first doped regions being formed by a first ion implanting of a dopant into the substrate through said gate oxide and through said first polysilicon layer overlying the first doped regions only at those regions of the first polysilicon that is not overlaid by the second polysilicon layer and preventing ion implanting of dopants in the substrate region that is overlaid by both the first and second polysilicon layers by using a mask that is comprised of a plurality of stacked masking layers that include the second polysilicon layer as one of the layers in the stacked mask;

selectively etching said first polysilicon layer to form a second gate region having a second length in said first direction, the second length being longer than said first length in said first direction, said first and second gate regions connected together over an isolation region of said substrate; and forming a plurality of second doped regions having a second doping level in said substrate by a second ion implanting of a dopant into the substrate through the gate oxide only and preventing ion implanting of dopants in the substrate region that is overlaid by the first polysilicon layer by using a mask that is comprised of a plurality of stacked masking layers that include the second gate region as one of the layers in the stacked mask, said second doped regions overlapping only a portion of said first doping regions and spaced away from the substrate region overlaid by the second layer of polysilicon, said second doping level being greater than said first doping level.

16. The method according to claim 15, further including:

forming lateral sidewall spacers on the sidewall of the stacked masking layers that include the second polysilicon layer after the first ion implanting step and prior to the etching of the first polysilicon layer.

* * * * *